(12) United States Patent
Peng et al.

(10) Patent No.: US 12,362,317 B2
(45) Date of Patent: Jul. 15, 2025

(54) SEMICONDUCTOR DIE DIPPING STRUCTURE

(71) Applicant: Taiwan Semiconductor Manufacturing Company, Ltd., Hsinchu (TW)

(72) Inventors: Chi-Chun Peng, Hsinchu (TW); Chih-Yuan Chiu, Zhudong Township (TW); Min-Yu Wu, Hsinchu (TW); Yi-Kai Tu, Hsinchu (TW); Cheng-Lung Wu, Zhunan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 816 days.

(21) Appl. No.: 17/677,702

(22) Filed: Feb. 22, 2022

(65) Prior Publication Data
US 2023/0023353 A1    Jan. 26, 2023

Related U.S. Application Data

(60) Provisional application No. 63/225,072, filed on Jul. 23, 2021.

(51) Int. Cl.
 *H01L 23/00* (2006.01)
 *B23K 1/20* (2006.01)
 (Continued)

(52) U.S. Cl.
 CPC .............. *H01L 24/97* (2013.01); *B23K 1/203* (2013.01); *B23K 3/082* (2013.01); *H01L 23/32* (2013.01);
 (Continued)

(58) Field of Classification Search
 CPC ...... B23K 1/0016; B23K 1/203; B23K 1/008; B23K 1/082; H05K 3/34; H05K 3/3405;
 (Continued)

(56) References Cited

U.S. PATENT DOCUMENTS 9,700,950 B2    7/2017  Jang et al.
10,600,755 B2   3/2020  Kim et al.
(Continued)

FOREIGN PATENT DOCUMENTS

CN    107920429 A  *  4/2018  ........... B23K 1/0016

OTHER PUBLICATIONS

Taiwan Office Action issued in connection with TW Appl. Ser. No. 111115082 dated Feb. 16, 2023 without English translation (9 pages).

*Primary Examiner* — Victor A Mandala
*Assistant Examiner* — Lawrence C Tynes, Jr.
(74) *Attorney, Agent, or Firm* — FOLEY & LARDNER LLP

(57) ABSTRACT

A die dipping structure includes a plate including a first recessed portion having a first depth and filled with a first flux material. The plate further includes a second recessed portion, isolated from the first recessed portion, with a second depth and filled with a second flux material. The second depth is different from the first depth. The die dipping structure further includes a motor configured to move the plate so as to simultaneously dip a first die and a second die into the flux of the first recessed portion and the flux of the second recessed portion, respectively.

20 Claims, 17 Drawing Sheets

(51) Int. Cl.
*B23K 3/08* (2006.01)
*H01L 23/32* (2006.01)

(52) U.S. Cl.
CPC .............. *H01L 24/75* (2013.01); *H01L 24/81* (2013.01); *H01L 2224/16227* (2013.01); *H01L 2224/75183* (2013.01); *H01L 2224/81024* (2013.01); *H01L 2224/81801* (2013.01); *H01L 2924/15311* (2013.01)

(58) Field of Classification Search
CPC .............. H05K 3/3421; H05K 3/3489; H05K 2203/044; H01L 2224/75183; H01L 2224/81024; H01L 2224/81801; H01L 21/67121
See application file for complete search history.

(56) References Cited

U.S. PATENT DOCUMENTS

| | | | |
|---|---|---|---|
| 2005/0045914 A1* | 3/2005 | Agranat | H01L 21/67132 257/200 |
| 2007/0111500 A1 | 5/2007 | Cowens et al. | |
| 2007/0243664 A1* | 10/2007 | Hirano | H01L 24/75 257/E21.511 |
| 2008/0029845 A1* | 2/2008 | Shen | H01L 24/48 257/E21.022 |
| 2009/0250504 A1* | 10/2009 | Chang | B23K 3/0623 228/36 |
| 2014/0048586 A1* | 2/2014 | Jang | B23K 1/203 228/36 |

* cited by examiner

SEMICONDUCTOR DIE DIPPING STRUCTURE

CROSS-REFERENCE TO RELATED APPLICATIONS

The present application claims priority to and the benefit of U.S. Provisional Application No. 63/225,072, filed Jul. 23, 2021, entitled "DUAL DIPPING PLATE," which is incorporated herein by reference in its entirety for all purposes.

BACKGROUND

Electronic equipment using semiconductor devices are essential for many modern applications. With the advancement of electronic technology, the semiconductor devices are becoming increasingly smaller in size while having greater functionality and greater amounts of integrated circuitry. During the packaged semiconductor device manufacturing, a number of chips or dies are assembled on a single semiconductor device. During manufacturing, a flux material is often applied to dies and acts as both a wetting agent and cleaning agent to enhance the quality of the any soldering bonds. The flux material also minimizes metallic oxidation which can occur at soldering temperatures, improving reliability of electrical connections.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
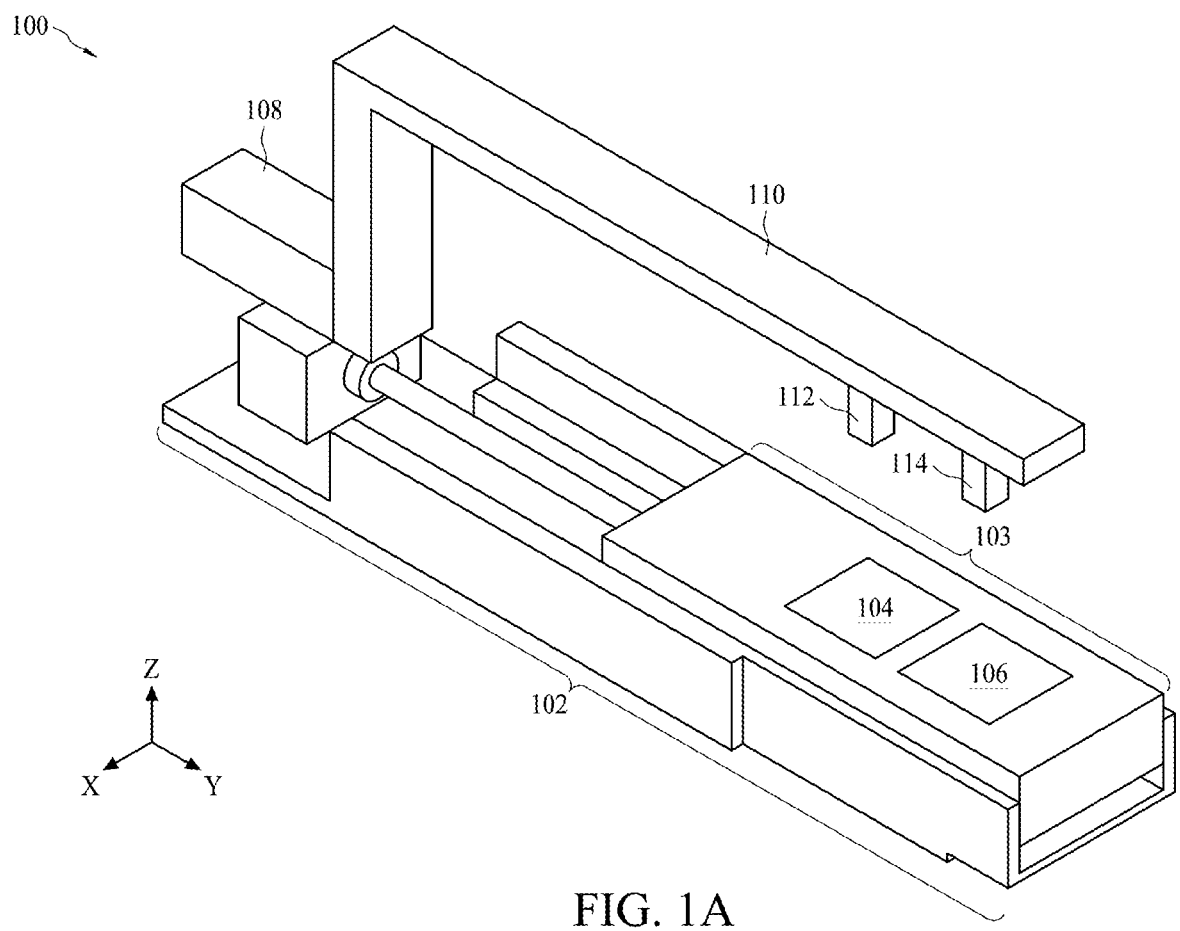
FIG. 1A illustrates a schematic view of a die dipping structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In this document, the term "coupled" may also be termed as "electrically coupled," and the term "connected" may be termed as "electrically connected." "Coupled" and "connected" may also be used to indicate that two or more elements cooperate or interact with each other.

A flux material is typically applied to either a die or a substrate to facilitate the formation of an interconnect. The flux material acts as an adhesive to hold the placed components in place pending soldering, and further acts to clean surface oxides from the substrate and to minimize metallic oxidation that occurs at soldering temperatures, thereby improving the electrical and mechanical interconnection and reliability between the soldered component and substrate. Controlling the amount of flux material applied to a die or a substrate is important since enough flux must be used to effect a reliable metallurgical bond while excess flux adversely impacts other manufacturing processes, such as resulting in adjacent solders, pads, or traces shorting to each other, resulting in bridging.

Generally, packaged semiconductor devices (e.g., Chip-on-Wafer-on-Substrate (CoWoS) packages, other integrated circuit chips, dies mounted to a substrate, etc.) incorporate multiple dies in order to achieve better interconnect density and performance. In such cases, the each die on the semiconductor packages may be conductive connectors, and the conductive connectors on one die may have a different height than the conductive connectors on another die. Each die may also be dipped in a semiconductor dipping structure configured to encapsulate the conductive connectors on each die with a flux material. Current die dipping structures utilize dipping plates with a single fixed thickness per plate. However, owing to changes in connector height, connector diameter, pre-solder type, and metal finish on the substrate, among others, dipping plates must be exchanged to achieve different flux thicknesses. As a result, the process is interrupted, thereby resulting in decreased throughput as well as the inability to utilize process controls which would allow for real time fine tuning of flux thicknesses.

The present disclosure relates to a semiconductor dipping structure (sometimes referred to as a die dipping structure) with multiple-type dipping depths and configured to handle multiple die production. In some embodiments, the semiconductor dipping structure includes a dipping plate with at least two dipping pools recessed in the dipping plate. Each dipping pool may have a different depth than the depth of the other dipping pools. For example, a first dipping pool may have a greater depth than a second dipping pool. Each dipping pool may also be filled with a flux material that may be any suitable dielectric material. The semiconductor dipping structure may also include at least two semiconductor dies, and each semiconductor die may have a connector. In some embodiments, the first semiconductor die may have a first connector with a first height, and the second semiconductor die may have a second connector with a second height. The first height may be greater than the second height. In some cases, the first semiconductor die may then be disposed in the first dipping pool, and the second semiconductor die may be disposed in the second dipping pool in order to encapsulate each connector on each die with the flux material. In some embodiments, these multiple-depth semiconductor dipping structures may be able to increase the productivity and reduce manufacturing time of semiconductor packages.

Figure 1B:
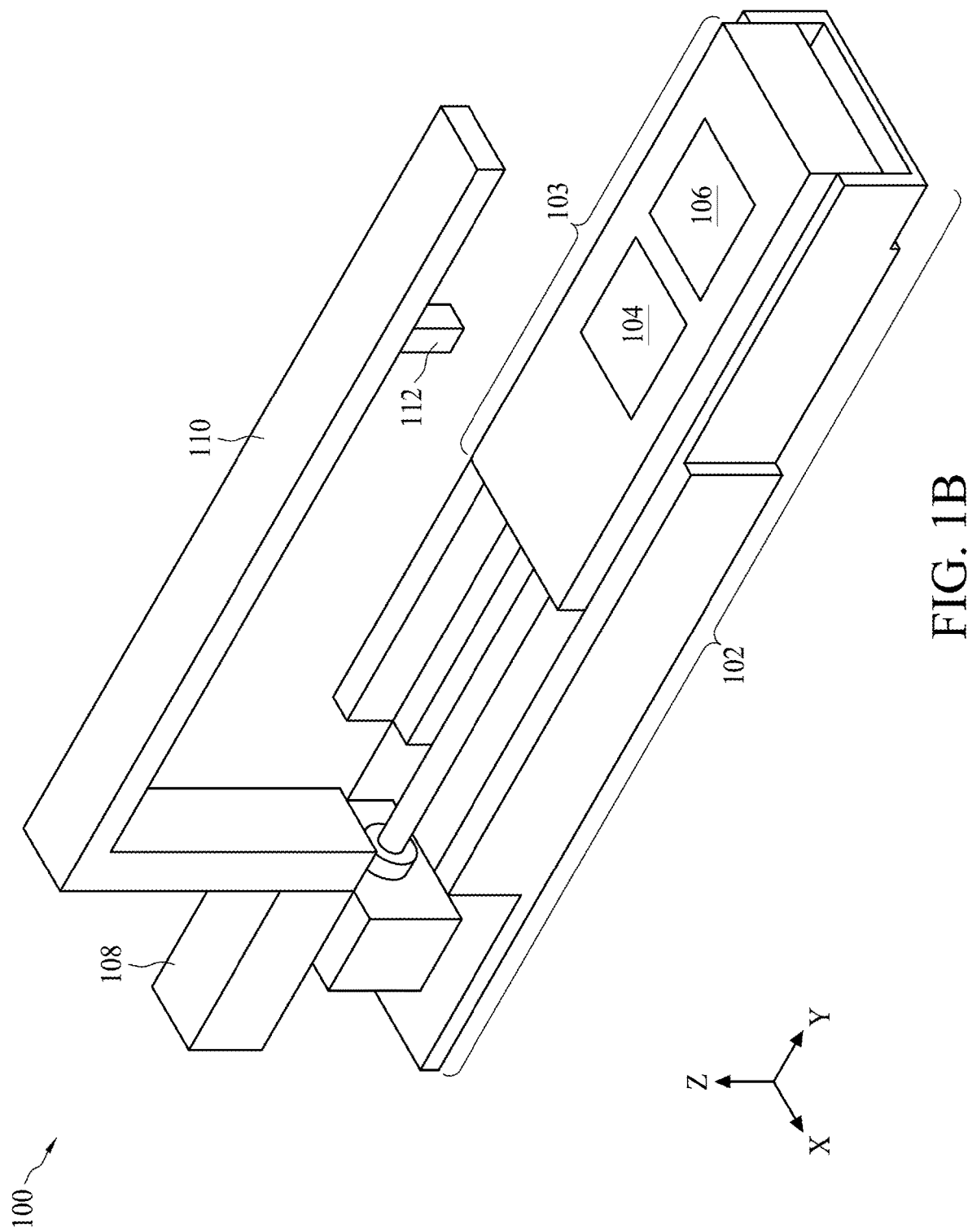
FIG. 1B illustrates a schematic view of a die dipping structure, in accordance with some embodiments.

FIGS. 1A-B illustrate schematic views of a die dipping structure 100 configured to apply a flux material to a workpiece, in accordance with some embodiments. The workpiece may be any semiconductor die or semiconductor package for which a flux material is used (e.g., CoWoS, integrated circuit packages, multi-chip packages, flat packages, etc.). For example, the workpiece can be a printed circuit board having a plurality of conductive terminals arranged on a surface thereof, or a plurality of flip-chip type electrical components. Connectors (sometimes referred to as solder bumps or bond pads) can be formed on the semiconductor package that will be electrically connected to corresponding structures on the semiconductor die. The die can be made on, for example, a silicon substrate or a gallium arsenide substrate. Connectors can be formed on the die corresponding to the connectors formed on the semiconductor package. The connector material can be a variety of Pb-based or Pb-free solders.

As shown in FIGS. 1A-B, the die dipping structure 100 includes a die dipping plate (or plate) 102. The die dipping plate 102 includes a dipping plate stage 103 with a first recessed portion (or first recess) 104 and a second recessed portion (or a second recess) 106. The first recessed portion 104 and the second recessed portion 106 may be spaced apart from each other in a first lateral direction (e.g., the Y-direction). Alternatively stated, the first recessed portion 104 and the second recessed portion 106 may be isolated or otherwise discrete from each other. As such, the first recessed portion 104 and the second recessed portion 106 can be separately configured to handle different workpieces, which will be discussed below.

For example, the first recessed portion 104 has a first depth and the second recessed portion 106 has a second depth. In one of various embodiments, the first depth is configured to be different from the second depth. The first recessed portion 104 and the second recessed portion 106 are configured to contain a first flux material and a second flux material, respectively. With the different depths, the first recessed portion 104 and the second recessed portion 106 can confine or otherwise hold the first flux material and the second flux material, which can be identical to or different from each other, in different heights. In another of various embodiments, the first depth is configured to be similar to the second depth. In such an embodiment, the first recessed portion 104 and the second recessed portion 106 may be filled with the first flux material and the second flux material, respectively, which can be identical to or different from each other, in different heights.

Further, the die dipping structure 100 includes a dipping plate motor 108 configured to move the plate 102 laterally (e.g., along the Y-direction) when desired. The die dipping structure 100 further includes a mechanical arm 110 configured to clamp or otherwise hold a first die and a second die, with their respective sides that have connectors facing down. In some embodiments, as illustrated in FIG. 1A, the mechanical arm 110 includes a first arm portion 112 and a second arm portion 114 configured to hold the first die and the second die, respectively. For example, the dipping plate motor 108 is configured to move the plate 102 to align the first recessed portion 104 with the first die and the second recessed portion 106 with the second die. Then, the mechanical arm 110 is configured to dip the first die disposed on the first arm portion 112 and the second die disposed on the second arm portion 114 into the first recessed portion 104 and the second recessed portion 106, respectively, and coat or otherwise overlay at least respective connectors of the first die and the second die with a flux material.

In some embodiments, as illustrated in FIG. 1B, the die dipping structure 100 includes the mechanical portion 110 with only the first arm portion 112. In such embodiments, the first arm portion 112 is first configured to hold the first die. The dipping plate motor 108 may then move the plate 102 to align one recessed portion (i.e., the first recessed portion 104) with the first die. The mechanical arm 110 then dips the first die into the recessed portion (i.e., the first recessed portion 104) to coat or otherwise overlay at least respective connectors of the first die with the flux material. Then, the first die may be removed from the first arm portion 112, and the second die may be placed on the first arm portion 112. The dipping plate motor 108 may then move the plate 102 to align a different recessed portion (i.e., the second recessed portion 106) with the second die. The mechanical arm 110 may then dip the second die into the recessed portion (i.e., the second recessed portion 106) to coat or otherwise overlay at least respective connectors of the second die with the flux material.

Figure 2:
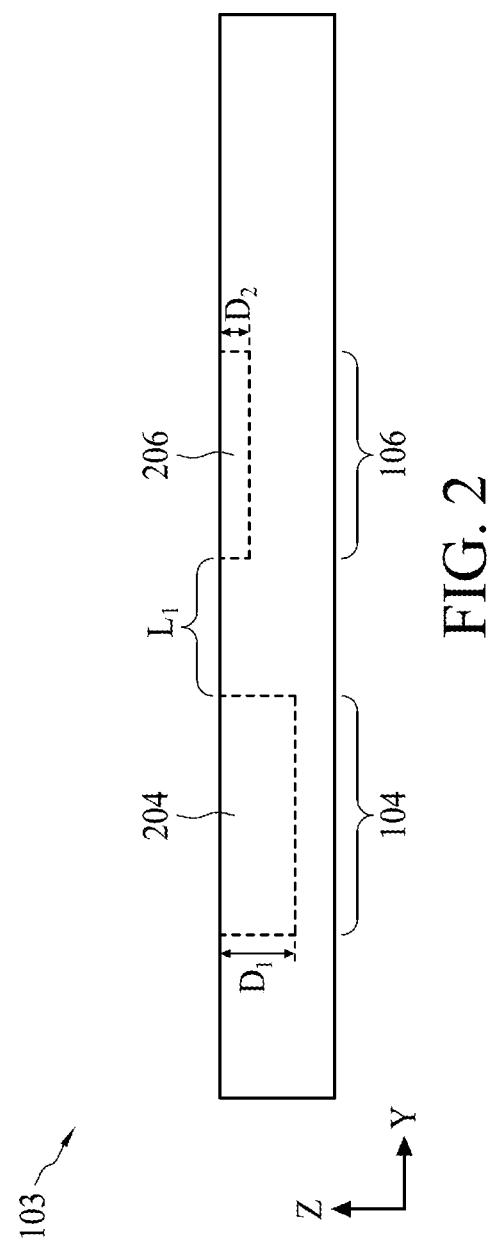
FIG. 2 illustrates a schematic view of a portion of an example die dipping structure, in accordance with some embodiments.

FIG. 2 illustrates a schematic view of a portion of the die dipping structure 100 including the dipping plate stage 103 with the first recessed portion 104 having a first depth $D_1$ and the second recessed portion 106 having a second depth $D_2$, in accordance with some embodiments. The first depth $D_1$ may be greater than or equal to about 20 micrometers (e.g., 20 micrometers, 25 micrometers, 30 micrometers, 35 micrometers, 40 micrometers, 45 micrometers, 50 micrometers, etc.). The second depth $D_2$ may be greater than or equal to about 1 micrometer (e.g., 1 micrometer, 2 micrometers, 5 micrometers, 10 micrometers, 15 micrometers, etc.). In some embodiments, the first depth $D_1$ may be greater than the second depth $D_2$. It is understood that although two recessed portions are illustrated in FIG. 2, the dipping plate stage 103 may have any number of discrete, recessed portions. The dipping plate stage 103 may have at least two recessed portions with varying depths, but it is understood that all of the recessed portions may have varying depths or that some of the recessed portions may have the same depth, as long as there at least two recessed portions with varying depths. In other embodiments, the first depth $D_1$ may be equal to the second depth $D_2$.

The first recessed portion 104 and the second recessed portion 106 are laterally spaced apart from each other in the Y-direction at a distance Li. Li may be greater than or equal to about 1 millimeter (e.g., 1 millimeter, 2 millimeters, 3 millimeters, 4 millimeters, 5 millimeters, 10 millimeters, etc.) so as to form discrete recessed portions. In some embodiments, the dipping plate stage 103 may have more than two recessed portions. In such embodiments, each recessed portion may be laterally spaced apart from each other in the Y-direction at a distance greater than or equal to about 1 millimeter. The recessed portions may be or may not be all equally spaced apart from each other.

The first recessed portion 104 and the second recessed portion 106 may be filled with a first flux material 204 and a second flux material 206, respectively. The first flux material 204 and the second flux material 206 may be any suitable flux material, such as a chloride flux, an organic flux, a rosin flux, combinations thereof, or any other suitable material. In some embodiments, a rosin flux is used because of its suitability for electronic soldering. The first flux material 204 and the second flux material 206 may comprise a suspension liquid of various acids suspended in an alcohol base. The first flux material 204 and the second flux material 206 may be the same as each other or different from each other. The first flux material 204 and the second flux material 206 may have a viscosity coefficient greater than or equal to about 6 kcps (e.g., 6 kcps, 7 kcps, 8 kcps, 9 kcps, 10 kcps, etc.). As such, the flux material can be confined around a corresponding connector, for example, when soldering the connector.

In some embodiments, the first depth $D_1$ is greater than the second depth $D_2$. In such embodiments, the first depth $D_1$ of the first recessed portion 104 may be completely filled with the first flux material 204, and the second depth Da of the second recessed portion 106 may be completely filled with the second flux material 206 (as illustrated in FIG. 2). In some embodiments, the first recessed portion 104 may be filled with the first flux material 204 up to a first height less than the first depth $D_1$. In some embodiments, the second recessed portion 106 may be filled with the second flux material 206 up to a second height less than the second depth $D_2$. In such embodiments, the first height and the second height are not equal to each other.

In some embodiments, the first depth $D_1$ may be equal to the second depth $D_2$. In such embodiments, the first recessed portion 104 may be filled with the first flux material 204 up to a first height less than the first depth $D_1$. In such embodiments, the second recessed portion 106 may be filled with the second flux material 206 up to a second height less than the second depth $D_2$. In such embodiments, the first height and the second height are not equal to each other.

Figure 3:
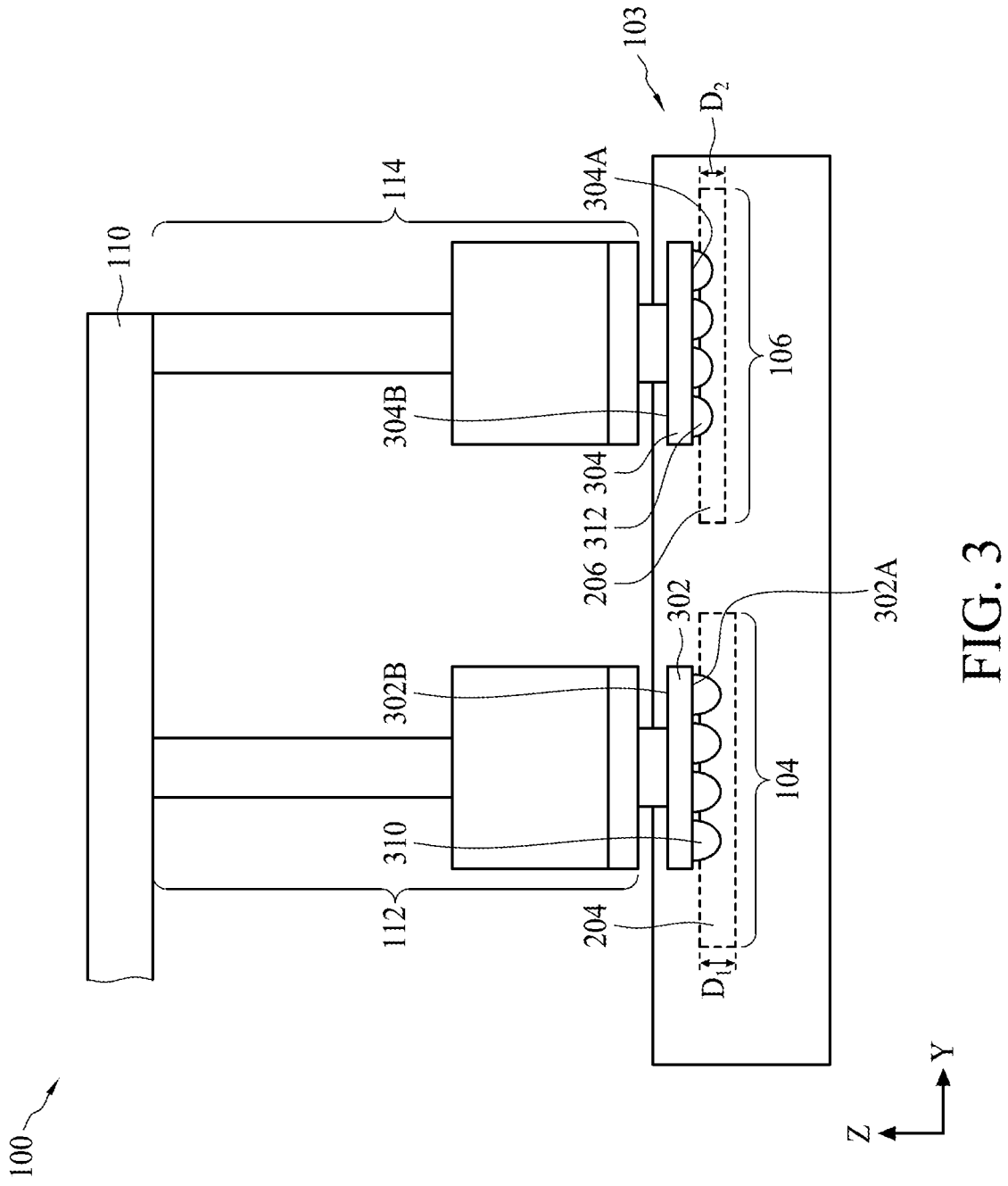
FIG. 3 illustrates a schematic view of another portion of an example die dipping structure, in accordance with some embodiments.

Referring to FIG. 3, a schematic view of the die dipping structure 100 holding a first die 302 and a second die 304 is shown, in accordance with some embodiments. In some embodiments, the die dipping structure 100 includes the mechanical arm 110 with the first arm portion 112 and the second arm portion 114 (as shown in FIG. 3). In such embodiments, the motor of the die dipping structure 100 moves the dipping plate stage 103 and/or the die dipping plate 102 to align the first die 302 and the second die 304 with the first recessed portion 104 and the second recessed portion 106, respectively. The first arm portion 112 is configured to hold the first die 302 with a first top surface 302A of the first die 302 facing down. Therefore, the first arm portion 112 is coupled to a first bottom surface 302B of the first die 302. The second arm portion 114 is configured to hold the second die 304 with a second top surface 304A of the second die 304 facing down. Therefore, the second arm portion 114 is coupled to a second bottom surface 304B of the second die 304.

In other embodiments, the die dipping structure 100 includes the mechanical arm 110 with only the first arm portion 112. In such embodiments, the first arm portion 112 is configured to first couple to the first bottom surface 302B of the first die 302, and the motor moves the dipping plate stage 103 and/or the die dipping plate 102 to align the first die 302 with the first recessed portion 104. Then, the first die 302 may be removed. Then, the first arm portion 112 may be configured to couple to the second bottom surface 304B of the second die 304, and the motor moves the dipping plate stage 103 and/or the die dipping plate 102 to align the second die 304 with the second recessed portion 106. It is understood that the first die 302 and the second die 304 may be coupled to the first arm portion 112 in any order.

As shown in FIG. 3, the first die 302 includes a first connector 310 on the first top surface 302A, and the second die 304 includes a second connector 312 on the second top surface 304A. The first connector 310 and the second connector 312 can be conductive (for example, comprising a metal such as copper) and are formed to provide an external electrical connection to the circuitry and devices. The first connector 310 and the second connector 312 may each comprise a plurality of conductive bumps.

In some embodiments, first die 302 and the second die 304 may be concurrently dipped by the first arm portion 112 and the second arm portion 114 into the first recessed portion 104 and the second recessed portion 106, respectively, so as to coat the first connector 310 and the second connector 312 with the first flux material 204 and the second flux material 206, respectively. In other embodiments, the first die 302 and the second die 304 may be sequentially dipped by the first arm portion 112 into the first recessed portion 104 and the second recessed portion 106, respectively, so as to coat the first connector 310 and the second connector 312 with the first flux material 204 and the second flux material 206, respectively.

Figure 4:
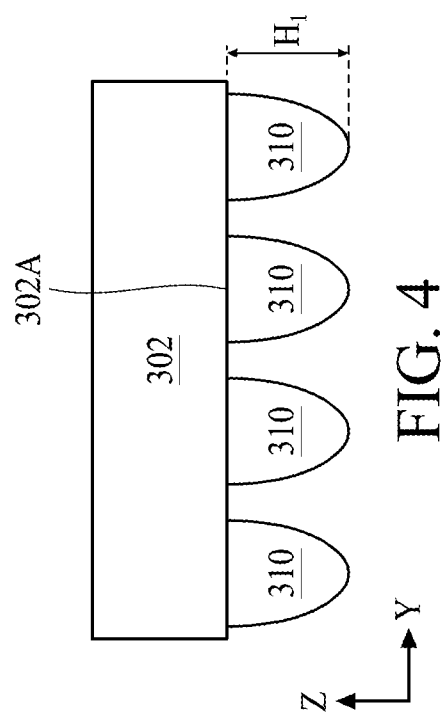
FIG. 4 illustrates a schematic view of a semiconductor die that may be connected to a die dipping structure, in accordance with some embodiments.

FIG. 4 illustrates a schematic view of the first die 302 with the first connector 310, in accordance with some embodiments. The first connector 310 has a first connector height $H_1$ that corresponds to either the first depth $D_1$ of the first recessed portion 104 or the first height of the first flux material 204 in the first recessed portion 104. The first connector height $H_1$ may be greater than the first depth $D_1$ of the first recessed portion 104 (FIG. 3). In some embodiments, a ratio of the first depth $D_1$ to the first connector height $H_1$ is less than or equal to 0.6. For purposes of clarity, additional components of the first die 302 (e.g., transistors, capacitors, resistors, diodes, etc.) may not be shown.

Figure 5:
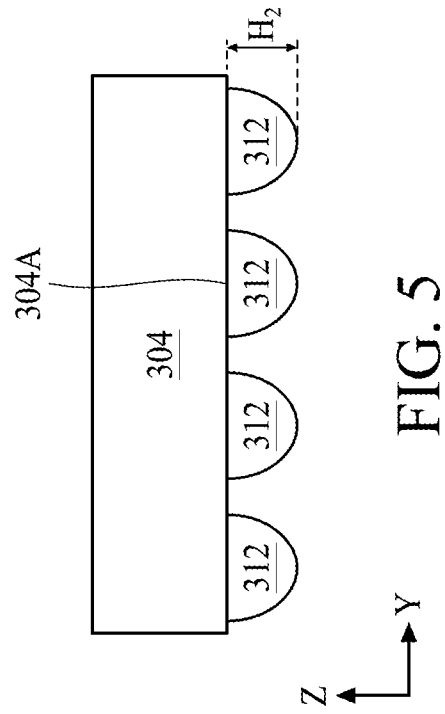
FIG. 5 illustrates a schematic view of a semiconductor die that may be connected to a die dipping structure, in accordance with some embodiments.

FIG. 5 illustrates a schematic view of the second die 304 with the second connector 312, in accordance with some embodiments. The second connector 312 has a second connector height $H_2$ that corresponds to either the second depth $D_2$ of the second recessed portion 106 or the second height of the second flux material 206 in the second recessed portion 106. The second connector height $H_2$ may be greater than the second depth $D_2$ of the second recessed portion 106 (FIG. 3). In some embodiments, a ratio of the second depth $D_2$ to the second connector height $H_2$ is less than or equal to 0.6. For purposes of clarity, additional components of the second die 304 (e.g., transistors, capacitors, resistors, diodes, etc.) may not be shown.

Figure 6:
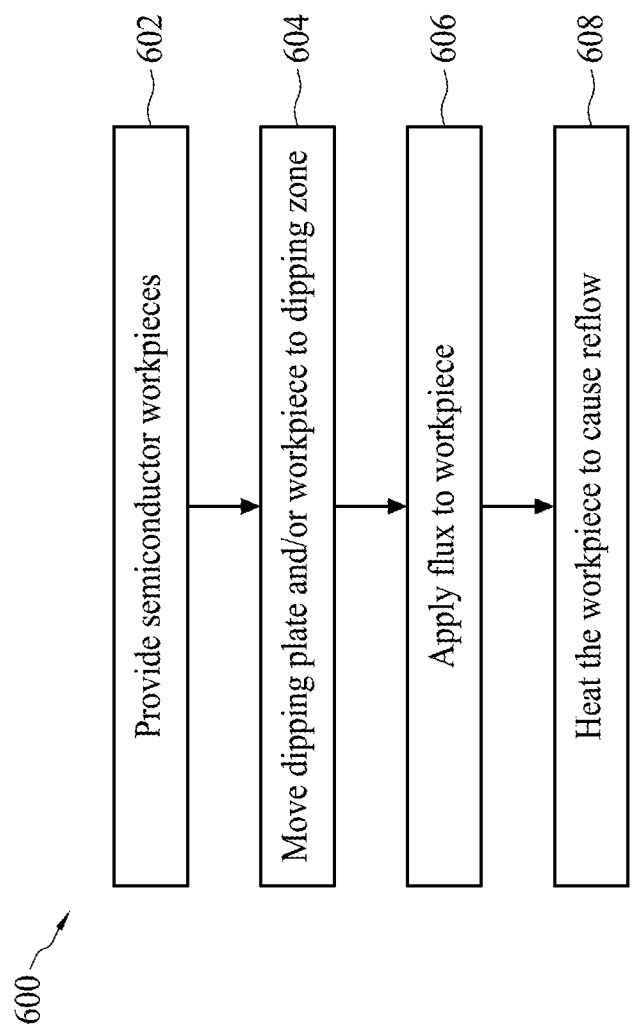
FIG. 6 illustrates a flow diagram of a method for application of a soldering flux to semiconductor workpieces, in accordance with some embodiments.

FIG. 6 illustrates a flow diagram of some embodiments of a method 600 for application of a soldering flux to semiconductor workpiece. While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 602, a first semiconductor workpiece and a second semiconductor workpiece are provided. The workpiece include connectors for mounting the workpiece.

At step 604, the dipping plate is moved relative to the semiconductor workpiece to provide the dipping zone having an appropriate depth, or the semiconductor workpiece are moved to the dipping zone having the appropriate depth while dipping plate remains stationary. Dipping of the workpiece then proceeds, at 606. The amount of flux material applied will depend on, for example, the size of the workpiece, the number of terminals on the workpiece, the type of solder employed, and the type of flux employed. Generally, the soldering flux is applied to a depth of about one-third to about two-thirds of the height of the connectors.

At step 608, the workpiece are heated to reflow the solder, forming an electrical interconnection between parts, and the process ends.

Figure 7:
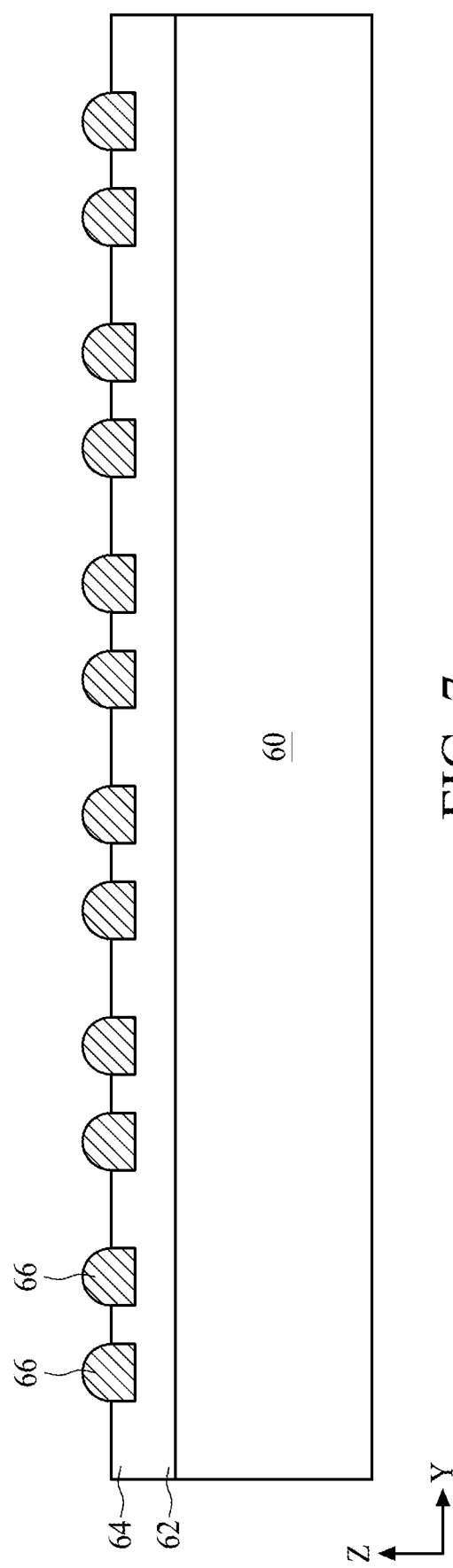
FIGS. 7-17 illustrate cross-sectional views in an example process of forming a package structure that may use a die dipping structure, in accordance with some embodiments.

FIG. 7 illustrates the formation of one or more dies 68 (shown in FIG. 8 below), in accordance with some embodiments. The dies 68 (substantially similar to the first die 302 and the second die 304) may be formed by a process that includes the die dipping structure 100 in FIGS. 1-5 above, wherein flux materials are applied to connectors of the dies 68. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

In some embodiments, the dies 68 may be used to form a Die-Interposer-Substrate stacked package using Chip-on-Wafer-on-Substrate (CoWoS) processing. It is understood that the die dipping structure 100 is not limited to such a package using CoWoS processing, and that this package is described for purposes of clarity.

A main body 60 of the dies 68 may comprise any number of dies, substrates, transistors, active devices, passive devices, combinations thereof, or any other suitable component. In an embodiment, the main body 60 may include a bulk semiconductor substrate, semiconductor-on-insulator (SOI) substrate, multi-layered semiconductor substrate, combinations thereof, or any other suitable substrate. The semiconductor material of the main body 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GainAs, GainP, and/or GainAsP; or combinations thereof. Other substrates, such as multi-layered or gradient substrates, may also be used. The main body 60 may be doped or undoped. Devices, such as transistors, capacitors, resistors, diodes, combinations thereof, or any other suitable component, may be formed in and/or on an active surface 62.

An interconnect structure 64 comprising one or more dielectric layer(s) and respective metallization pattern(s) is formed on the active surface 62. The metallization pattern(s) in the dielectric layer(s) may route electrical signals between the devices, such as by using vias and/or traces, and may also contain various electrical devices, such as capacitors, resistors, inductors, combinations thereof, or any other suitable component. The various devices and metallization patterns may be interconnected to perform one or more functions. The functions may include memory structures, processing structures, sensors, amplifiers, power distribution, input/output circuitry, combinations thereof, or any other suitable function.

Additionally, die connectors 66 (e.g., similar to the first connector 310 and the second connector 312 of FIG. 3), such as conductive bumps (for example, comprising a metal such as copper), are formed in and/or on the interconnect structure 64 to provide an external electrical connection to the circuitry and devices. In some embodiments, the die connectors 66 include a conductive material such as copper, aluminum, gold, nickel, palladium, combinations thereof, or any other suitable material and may be formed by sputtering, printing, electro plating, electroless plating, CVD, combinations thereof, or any other suitable method. The die connectors 66 protrude from the interconnect structure 64 to form curved or bumped structure to be utilized when bonding the dies 68 to other structures. In some embodiments, the die connectors 66 are formed by forming a layer of solder. Once a layer of solder has been formed on the structure, a reflow may be performed in order to shape the material into the desired bump shapes. One of ordinary skill in the art will appreciate that the above examples are provided for illustrative purposes. Other circuitry may be used as appropriate for a given application.

In some embodiments, the die connectors 66 may be coated with a flux before bonding to any other component. The die connectors 66 may dipped in the flux using the die dipping structure 100 from FIGS. 1-5. In some embodiments, the die connectors 66 may have an epoxy flux (not shown) formed thereon before they are reflowed with at least some of the epoxy portion of the epoxy flux remaining. This remaining epoxy portion may act as an underfill to reduce stress and protect the joints resulting from the reflowing the die connectors 66.

More particularly, an inter-metallization dielectric (IMD) layer may be formed in the interconnect structure 64. The IMD layer may be formed, for example, of a low-k dielectric material, such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or any other suitable material, by any suitable method known in the art, such as spinning, chemical vapor deposition (CVD), plasma-enhanced CVD (PECVD), high-density plasma chemical vapor deposition (HDP-CVD), combinations thereof, or any other suitable method. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer.

The recesses and/or openings may be lined with a diffusion barrier layer and filled with a conductive material. The diffusion barrier layer may comprise one or more layers of tantalum nitride, tantalum, titanium nitride, titanium, cobalt tungsten, any other suitable material, or a combination thereof, deposited by atomic layer deposition (ALD), or any other suitable method. The conductive material of the metallization patterns may comprise copper, aluminum, tungsten, silver, combinations thereof, or any other suitable material, deposited by CVD, physical vapor deposition (PVD), combinations thereof, or any other suitable method. Any excessive diffusion barrier layer and/or conductive material on the IMD layer may be removed, such as by using a chemical mechanical polish (CMP).

Figure 8:
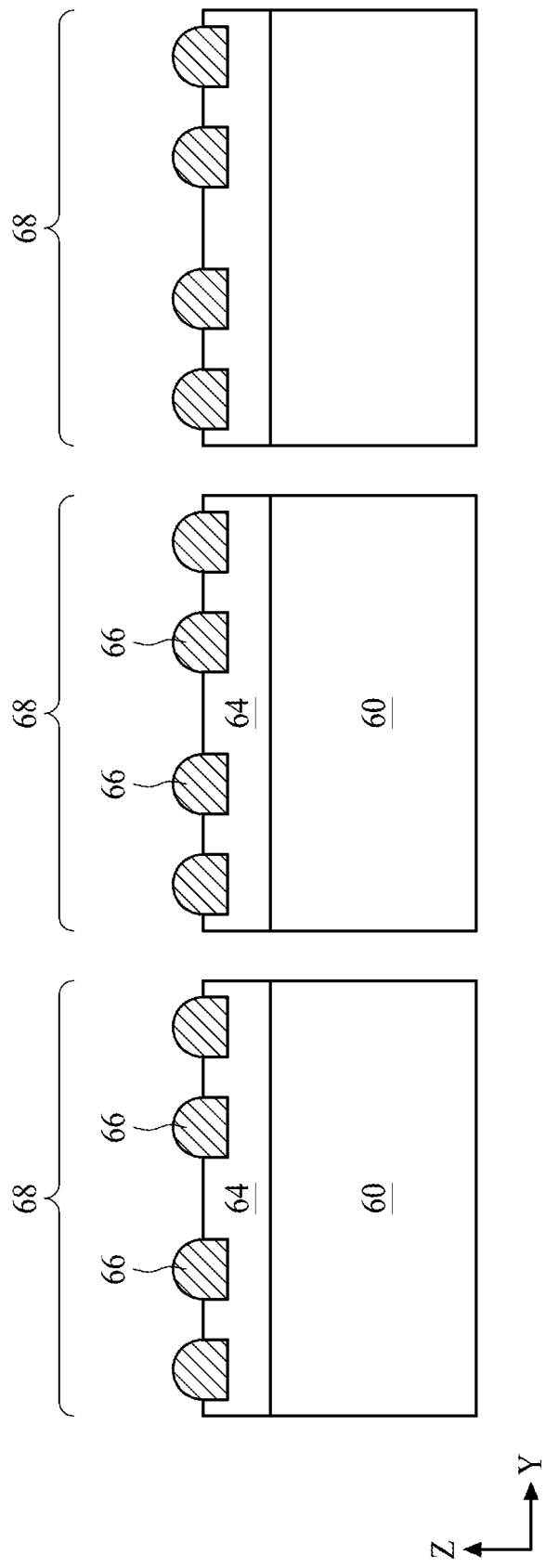

In FIG. 8, the main body 60 including the interconnect structure 64 is singulated into individual dies 68. Typically, the dies 68 contain the same circuitry, such as devices and metallization patterns, although the dies may have different circuitry. The singulation may include sawing, dicing, combinations thereof, or any other suitable method.

Each of the dies 68 may include one or more logic dies (e.g., central processing unit, graphics processing unit, system-on-a-chip, field-programmable gate array (FPGA), microcontroller, or combinations thereof, or any other suitable die), memory dies (e.g., dynamic random access memory (DRAM) die, static random access memory (SRAM) die, combinations thereof, or any other suitable die), power management dies (e.g., power management integrated circuit (PMIC) die), radio frequency (RF) dies, sensor dies, micro-electromechanical-system (MEMS) dies, signal processing dies (e.g., digital signal processing (DSP) die), front-end dies (e.g., analog front-end (AFE) dies), any other suitable die, or a combination thereof. Also, in some embodiments, the dies 68 may be different sizes (e.g., different heights and/or surface areas), and in other embodiments, the dies 68 may be the same size (e.g., same heights and/or surface areas).

Figure 9:
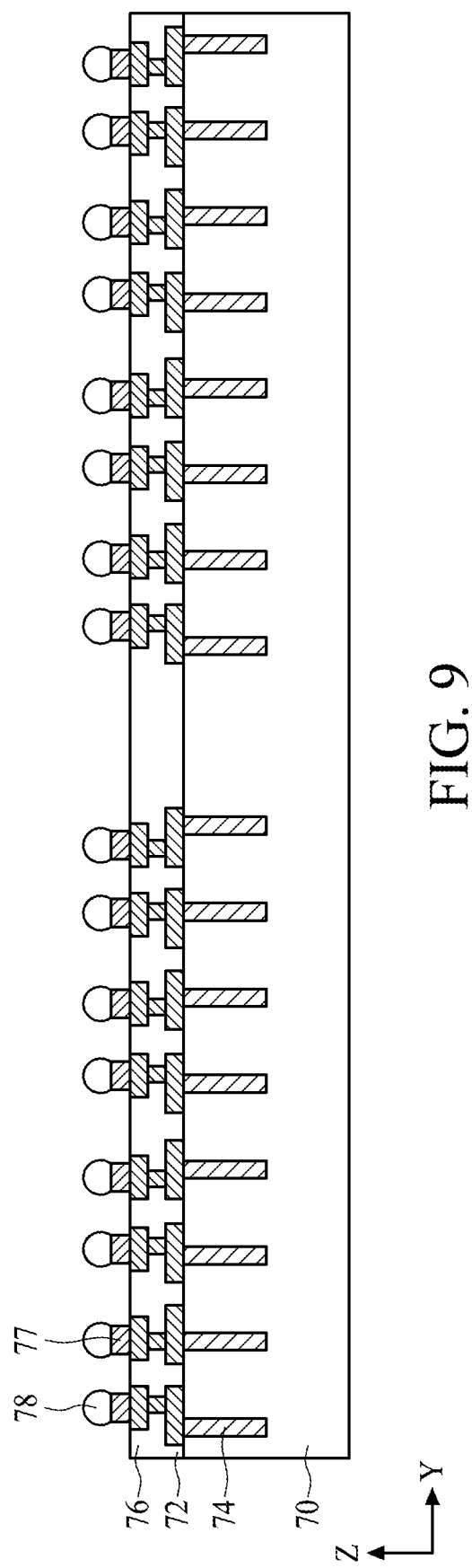
Figure 17:
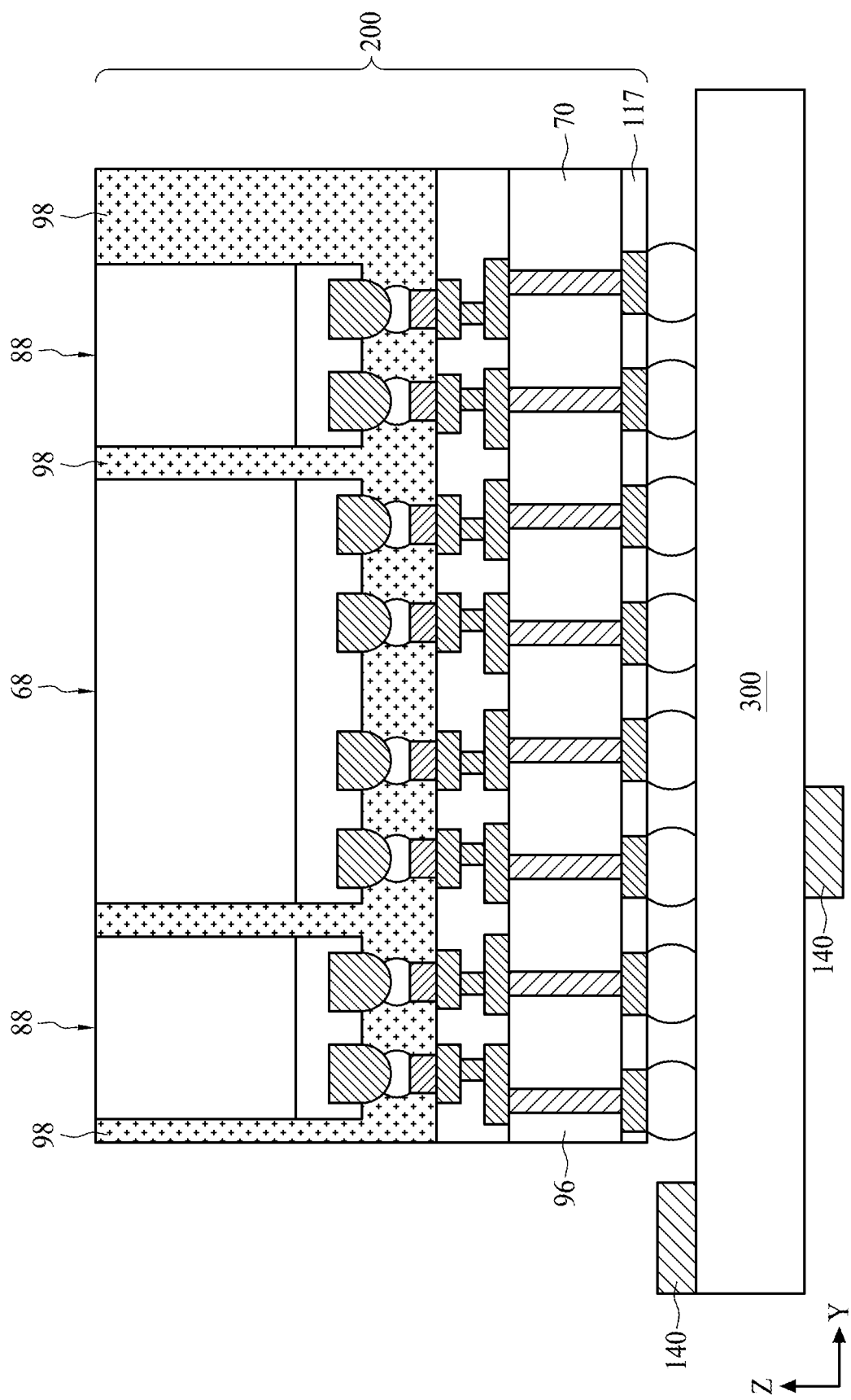

FIG. 9 illustrates the formation of a first side of components 96 (see FIG. 17). A substrate 70 comprises one or more components 96 during processing. The components 96 may be an interposer or another die. The substrate 70 can be a wafer. The substrate 70 may comprise a bulk semiconductor substrate, SOI substrate, multi-layered semiconductor substrate, combinations thereof, or any other suitable substrate. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 70 may be doped or undoped. Devices, such as transistors, capacitors, resistors, diodes, combinations thereof, or any other suitable component, may be formed in and/or on a first surface 72, which may also be referred to as an active surface, of the substrate 70. In embodiments where component 96 is an interposer, component 96 will generally not include active devices therein, although the interposer may include passive devices formed in and/or on a first surface 72.

Through-vias (TVs) 74 are formed to extend from the first surface 72 of substrate 70 into substrate 70. The TVs 74 are also sometimes referred to as through-substrate vias or through-silicon vias when substrate 70 is a silicon substrate. The TVs 74 may be formed by forming recesses in the substrate 70 by, for example, etching, milling, laser techniques, a combination thereof, or any other suitable method.

A thin dielectric material may be formed in the recesses, such as by using an oxidation technique. A thin barrier layer may be conformally deposited over the front side of the substrate 70 and in the openings, such as by CVD, ALD, PVD, thermal oxidation, combinations thereof, or any other suitable method. The barrier layer may comprise a nitride or an oxynitride, such as titanium nitride, titanium oxynitride, tantalum nitride, tantalum oxynitride, tungsten nitride, combinations thereof, or any other suitable material. A conductive material may be deposited over the thin barrier layer and in the openings. The conductive material may be formed by an electrochemical plating process, CVD, ALD, PVD, combinations thereof, or any other suitable process. Examples of conductive materials are copper, tungsten, aluminum, silver, gold, combinations thereof, or any other suitable material. Excess conductive material and barrier layer is removed from the front side of the substrate 70 by, for example, CMP. Thus, the TVs 74 may comprise a conductive material and a thin barrier layer between the conductive material and the substrate 70.

Redistribution structure 76 is formed over the first surface 72 of the substrate 70, and is used to electrically connect the integrated circuit devices, if any, and/or TVs 74 together and/or to external devices. The redistribution structure 76 may include one or more dielectric layer(s) and respective metallization pattern(s) in the dielectric layer(s). The metallization patterns may comprise vias and/or traces to interconnect any devices and/or TVs 74 together and/or to an external device. The metallization patterns are sometimes referred to as Redistribution Lines (RDL). The dielectric layers may comprise silicon oxide, silicon nitride, silicon carbide, silicon oxynitride, low-k dielectric material, such as PSG, BPSG, FSG, SiOxCy, Spin-On-Glass, Spin-On-Polymers, silicon carbon material, compounds thereof, composites thereof, combinations thereof, or any other suitable material. The dielectric layers may be deposited by any suitable method known in the art, such as spinning, CVD, PECVD, HDP-CVD, combinations thereof, or any other suitable method. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, combinations thereof, or any other suitable material, deposited by ALD, or the any other suitable method, and the conductive material may comprise copper, aluminum, tungsten, silver, combinations thereof, or any other suitable material, deposited by CVD, PVC, combinations thereof, or any other suitable method. Any excessive diffusion barrier layer and/or conductive material on the dielectric layer may be removed, such as by using a CMP.

Electrical connectors 77/78 are formed at the top surface of the redistribution structure 76 on conductive pads. In some embodiments, the conductive pads include under bump metallurgies (UBMs). In the illustrated embodiment, the pads are formed in openings of the dielectric layers of the redistribution structure 76. In another embodiment, the pads (UBMs) can extend through an opening of a dielectric layer of the redistribution structure 76 and also extend across the top surface of the redistribution structure 76. As an example to form the pads, a seed layer (not shown) is formed at least in the opening in the dielectric layer of the redistribution structure 76. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or any other suitable method. A photoresist is then formed and patterned on the seed layer. The photoresist may be formed by spin coating or any other suitable method and may be exposed to light for patterning. The pattern of the photo resist corresponds to the pads. The patterning forms openings through the photo resist to expose the seed layer.

A conductive material is formed in the openings of the photoresist and on the exposed portions of the seed layer. The conductive material may be formed by plating, such as electroplating or electroless plating, or any other suitable method. The conductive material may comprise a metal, like copper, titanium, tungsten, aluminum, combinations thereof, or any other material. Then, the photoresist and portions of the seed layer on which the conductive material is not formed are removed. The photoresist may be removed by an acceptable ashing or stripping process, such as using an oxygen plasma or any suitable method. Once the photoresist is removed, exposed portions of the seed layer are removed, such as by using an acceptable etching process, such as by wet or dry etching. The remaining portions of the seed layer and conductive material form the pads. In the embodiment, where the pads are formed differently, more photoresist and patterning steps may be utilized.

In some embodiments, the electrical connectors 77/78 include a metal pillar 77 with a metal cap layer 78, which may be a solder cap, over the metal pillar 77. The electrical connectors 77/78 including the pillar 77 and the cap layer 78 are sometimes referred to as micro bumps 77/78. In some embodiments, the metal pillars 77 include a conductive material such as copper, aluminum, gold, nickel, palladium, the like, or a combination thereof and may be formed by sputtering, printing, electro plating, electroless plating, CVD, or the like. The metal pillars 77 may be solder free and have substantially vertical sidewalls. In some embodiments, a metal cap layer 78 is formed on the top of the metal pillar 77. The metal cap layer 78 may include nickel, tin, tin-lead, gold, copper, silver, palladium, indium, nickel-palladium-gold, nickel-gold, the like, or a combination thereof and may be formed by a plating process.

In another embodiment, the electrical connectors 77/78 are solder balls and/or bumps, such as controlled collapse chip connection (C4), electroless nickel immersion Gold (ENIG), electroless nickel electroless palladium immersion gold technique (EN-nickel electroless palladium immersion gold technique (EN-EPIG) formed bumps, or any other suitable bump. In this embodiment, the bump electrical connectors 77/78 may include a conductive material such as solder, copper, aluminum, gold, nickel, silver, palladium, tin, combinations thereof, or any other suitable material. In some embodiment, the electrical connectors 77/78 are formed by initially forming a layer of solder through such commonly used methods such as evaporation, electroplating, printing, solder transfer, ball placement, combinations thereof, or any other suitable method. In some embodiments, the electrical connectors 77/78 are formed by forming a layer of solder. Once a layer of solder has been formed on the structure, a reflow may be performed in order to shape the material into the desired bump shapes.

Figure 10:
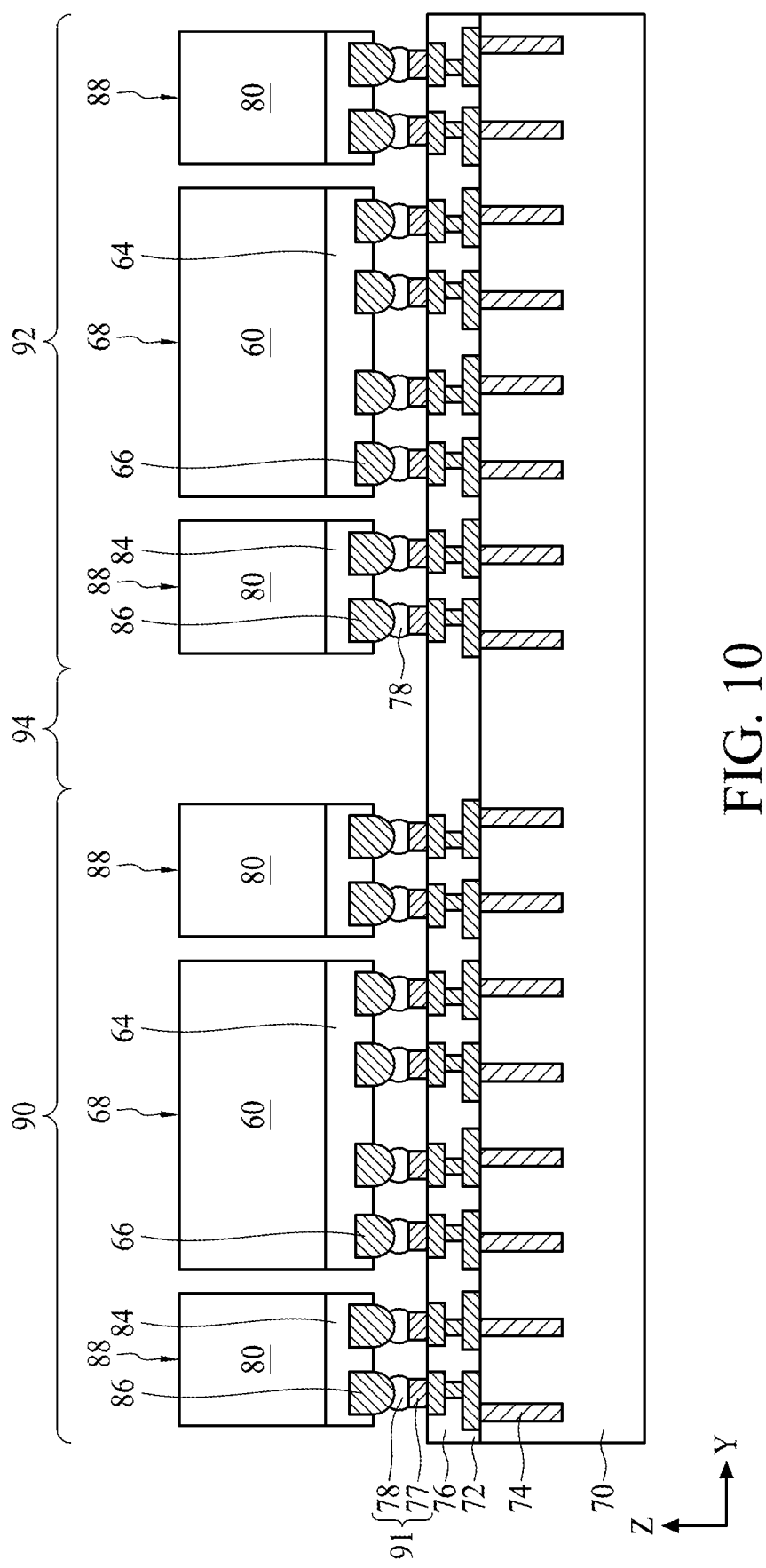

In FIG. 10, the dies 68 and the dies 88 are attached to the first side of the components 96, for example, through flip-chip bonding by way of the electrical connectors 77/78 and the die connectors 66 and 86 to form conductive joints 91. The die connectors 86 may be similar to the die connectors 66 and the description is not repeated herein. The dies 68 and the dies 88 may be placed on the electrical connectors 77/78 using, for example, a pick-and-place tool. In some embodiments, a metal cap layer (not shown) may be formed on the die connectors 66 and 86. The metal cap layer may include nickel, tin, tin-lead, gold, silver, palladium, indium, nickel-palladium-gold, nickel-gold, combinations thereof, or any other suitable material and may be formed by a plating process.

The dies 88 may be formed through similar processing as described above in reference to the dies 68. In some embodiments, the dies 88 include one or more memory dies, such as a stack of memory dies (e.g., DRAM dies, SRAM dies, High-Bandwidth Memory (HBM) dies, Hybrid Memory Cubes (HMC) dies, combinations thereof, or any other suitable die). In the stack of memory dies embodiments, a die 88 can include both memory dies and a memory controller, such as, for example, a stack of four or eight memory dies with a memory controller. Also, in some embodiments, the dies 88 may be different sizes (e.g., different heights and/or surface areas), and in other embodiments, the dies 88 may be the same size (e.g., same heights and/or surface areas).

In some embodiments, the dies 88 may be similar heights to those of the dies 68 (as shown in FIG. 10) or in some embodiments, the dies 68 and 88 may be of different heights. The dies 88 include a main body 80, an interconnect structure 84, and die connectors 86. The main body 80 of the dies 88 may comprise any number of dies, substrates, transistors, active devices, passive devices, combinations thereof, or any other suitable component. In an embodiment, the main body 80 may include a bulk semi-conductor substrate, semiconductor-on-insulator (SOI) substrate, multi-layered semiconductor substrate, combinations thereof, or any other suitable substrate. The semiconductor material of the main body 80 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 80 may be doped or undoped. Devices, such as transistors, capacitors, resistors, diodes, combinations thereof, or any other suitable component, may be formed in and/or on an active surface.

An interconnect structure 84 comprising one or more dielectric layer(s) and respective metallization pattern(s) is formed on the active surface. The metallization pattern(s) in the dielectric layer(s) may route electrical signals between the devices, such as by using vias and/or traces, and may also contain various electrical devices, such as capacitors, resistors, inductors combinations thereof, or any other suitable component. The various devices and metallization patterns may be interconnected to perform one or more functions. The functions may include memory structures, processing structures, sensors, amplifiers, power distribution, input/output circuitry, combinations thereof, or any other suitable function.

Additionally, die connectors 86, such as conductive bumps (for example, comprising a metal such as copper), are formed in and/or on the interconnect structure 84 to provide an external electrical connection to the circuitry and devices. In some embodiments, the die connectors 86 protrude from the interconnect structure 84 to form curved or bumped structure to be utilized when bonding the dies 88 to other structures. In some embodiments, the die connectors 88 are formed by forming a layer of solder. Once a layer of solder has been formed on the structure, a reflow may be performed in order to shape the material into the desired bump shapes. One of ordinary skill in the art will appreciate that the above examples are provided for illustrative purposes. Other circuitry may be used as appropriate for a given application.

In some embodiments, the die connectors 86 may be coated with a flux before bonding to any other component. The die connectors 86 may dipped in the flux using the die dipping structure 100 from FIGS. 1-5. In some embodiments, the die connectors 86 may have an epoxy flux (not shown) formed thereon before they are reflowed with at least some of the epoxy portion of the epoxy flux remaining. This remaining epoxy portion may act as an underfill to reduce stress and protect the joints resulting from the reflowing the die connectors 86.

More particularly, an IMD layer may be formed in the interconnect structure 84. The IMD layer may be formed, for example, of a low-k dielectric material, such as PSG, BPSG, FSG, SiOxCy, Spin-On-Glass, Spin-On-Polymers, silicon carbon material, compounds thereof, composites thereof, combinations thereof, or any other suitable material, by any suitable method known in the art, such as spinning, CVD, PECVD, HDP-CVD, combinations thereof, or any other suitable method. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, combinations thereof, or any other suitable material, deposited by ALD, or any other suitable method. The conductive material of the metallization patterns may comprise copper, aluminum, tungsten, silver, and combinations thereof, combinations thereof, or any other suitable material, deposited by CVD, PVD, combinations thereof, or any other suitable method. Any excessive diffusion barrier layer and/or conductive material on the IMD layer may be removed, such as by using a CMP.

The conductive joints 91 electrically couple the circuits in the dies 68 and the dies 88 through interconnect structures 84 and 64 and die connectors 86 and 66, respectively, to redistribution structure 76 and TVs 74 in components 96.

In some embodiments, before bonding the electrical connectors 77/78, the electrical connectors 77/78 are coated with a flux (not shown), such as a no-clean flux. The electrical connectors 77/78 may be dipped in the flux or the flux may be jetted onto the electrical connectors 77/78. The electrical connectors 77/78 may dipped in the flux using the die dipping structure 100 from FIGS. 1-5. In some embodiments, the electrical connectors 77/78 may have an epoxy flux (not shown) formed thereon before they are reflowed with at least some of the epoxy portion of the epoxy flux remaining after the dies 68 and the dies 88 are attached to the components 96. This remaining epoxy portion may act as an underfill to reduce stress and protect the joints resulting from the reflowing the electrical connectors 77/78.

The bonding between the dies 68 and 88 and the components 96 may be a solder bonding or a direct metal-to-metal (such as a copper-to-copper or tin-to-tin) bonding. In an embodiment, the dies 68 and the dies 88 are bonded to the components 96 by a reflow process. During this reflow process, the electrical connectors 77/78 are in contact with the die connectors 66 and 86, respectively, and the pads of the redistribution structure 76 to physically and electrically couple the dies 68 and the dies 88 to the components 96. After the bonding process, an IMC (not shown) may form at the interface of the electrical connectors 77/78 and the die connectors 66 and 86.

In FIG. 10 and subsequent figures, a first package region 90 and a second package region 92 for the formation of a first package and a second package, respectively, are illustrated. Region 94 is between adjacent package regions. As illustrated in FIG. 10, a first die and multiple second dies are attached in each of the first package region 90 and the second package region 92.

In some embodiments, the dies 68 are system-on-a-chip (SoC) or a graphics processing unit (GPU) and the second dies are memory dies that may utilized by the dies 68. In an embodiment, the dies 88 are stacked memory dies. For example, the stacked memory dies 88 may include low-power (LP) double data rate (DDR) memory modules, such as LPDDR1, LPDDR2, LPDDR3, LPDDR4, combinations thereof, or any other suitable memory module.

Figure 11:
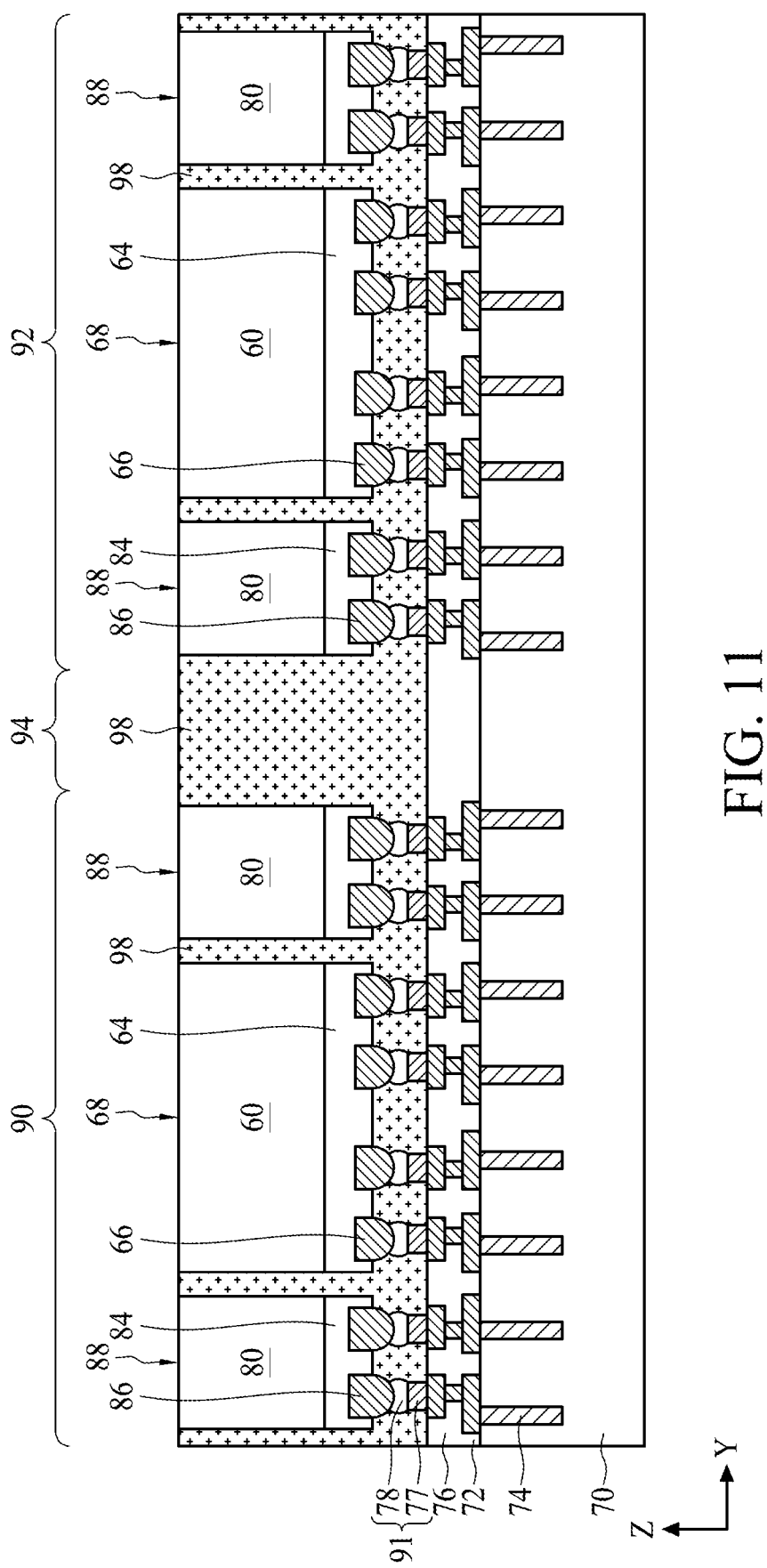

In FIG. 11, an underfill material 98 is dispensed into the gaps between the dies 68, the dies 88, and the redistribution structure 76. The underfill material 98 may extend up along sidewall of the dies 68 and the dies 88. The underfill material 98 may be any acceptable material, such as a polymer, epoxy, molding underfill, combinations thereof, or any other suitable material. The underfill material 98 may be formed by a capillary flow process after the dies 68 and 88 are attached, or may be formed by a suitable deposition method before the dies 68 and 88 are attached.

Figure 12:
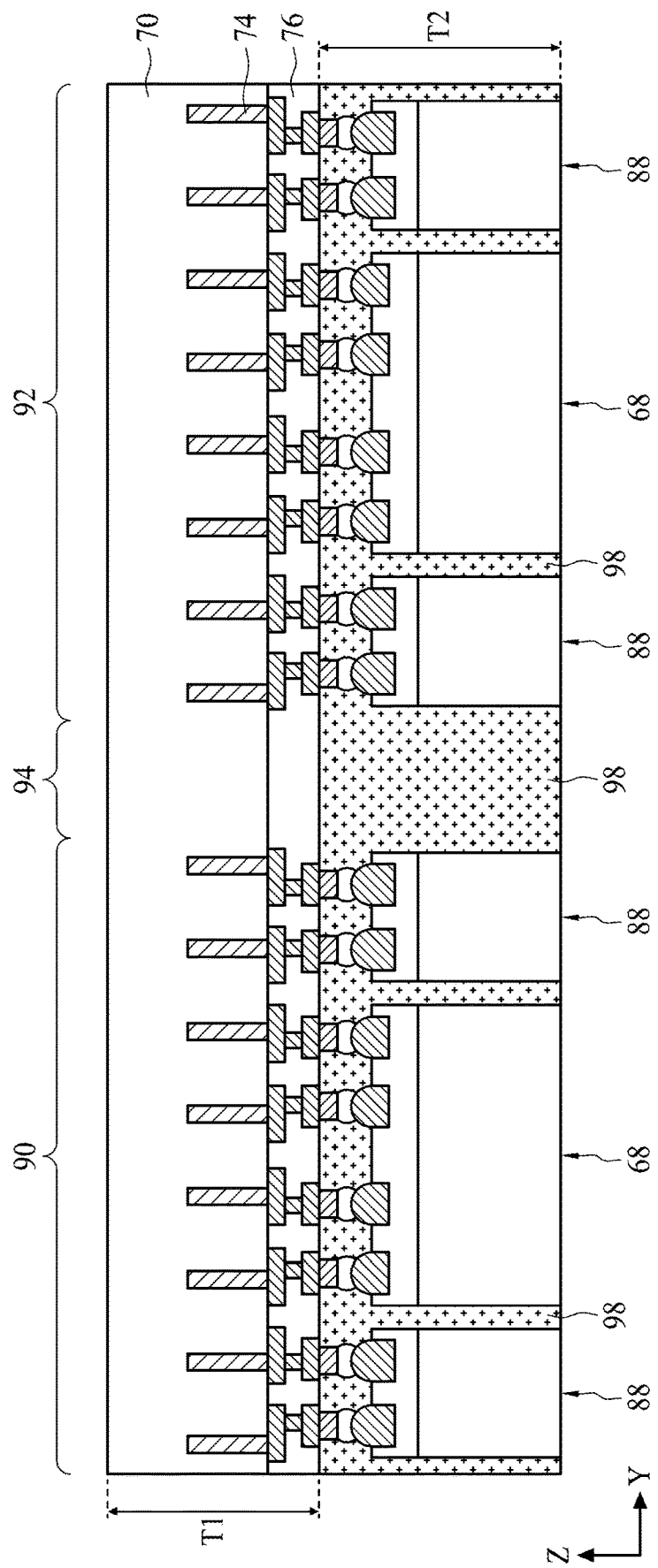

FIGS. 12 through 15 illustrate the formation of the second side of components 96. In FIG. 12, the structure of FIG. 11 is flipped over to prepare for the formation of the second side of components 96. Although not shown, the structure may be placed on carrier or support structure for the process of FIGS. 12 through 15. As shown in FIG. 12, at this stage of processing, the substrate 70 and redistribution structure 76 of the components 96 have a combined thickness $T_1$ in a range from about 50 μm to about 775 μm, such as about 775 μm. The rest of the structure may have a thickness $T_2$ in a range from about 30 μm to about 775 μm, such as about 760 μm. In some embodiments, one or both of the dies 68 and 88 (including conductive joints 91) have the thickness $T_2$.

Figure 13:
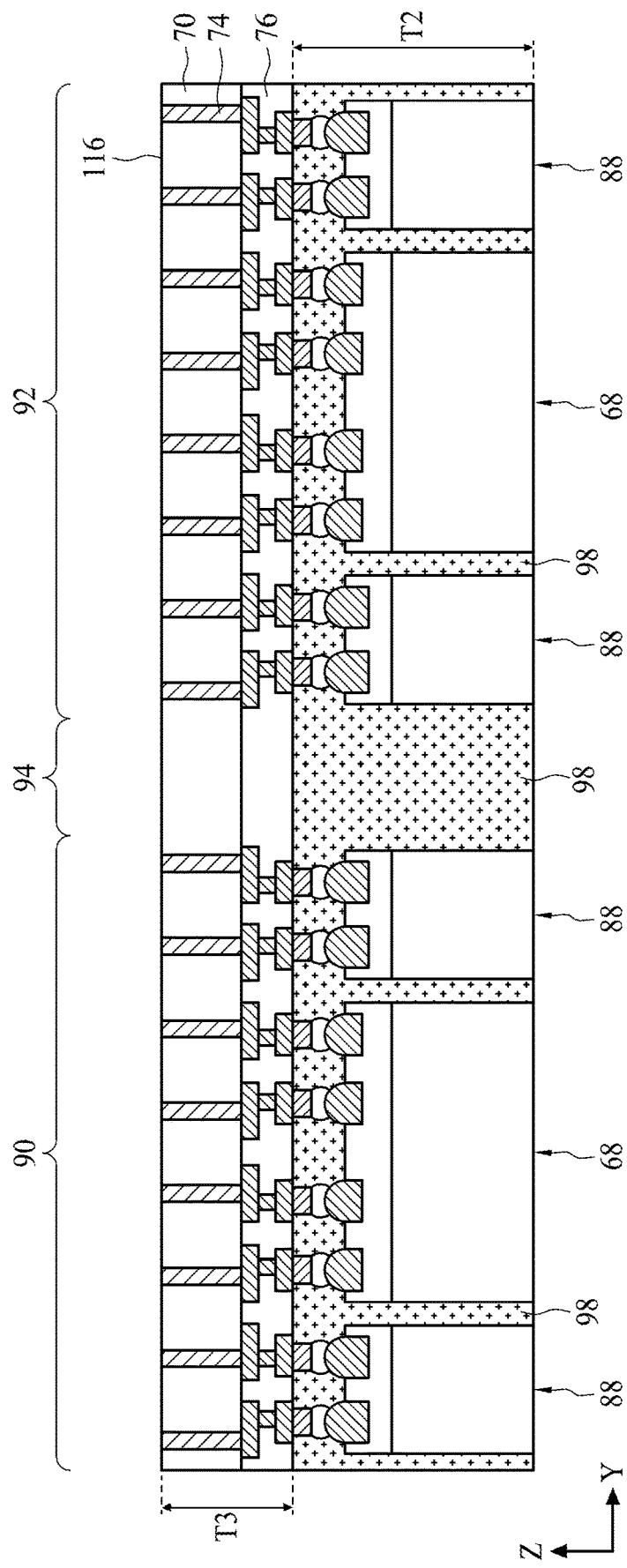

In FIG. 13, a thinning process is performed on the second side of the substrate 70 to thin the substrate 70 to a second surface 116 until TVs 74 are exposed. The thinning process may include an etching process, a grinding process, combinations thereof, or any other suitable process. In some embodiments, after the thinning process, the substrate 70 and redistribution structure 76 of the components 96 have a combined thickness $T_3$ in a range from about 30 μm to about 200 μm, such as about 100 μm.

Figure 14:
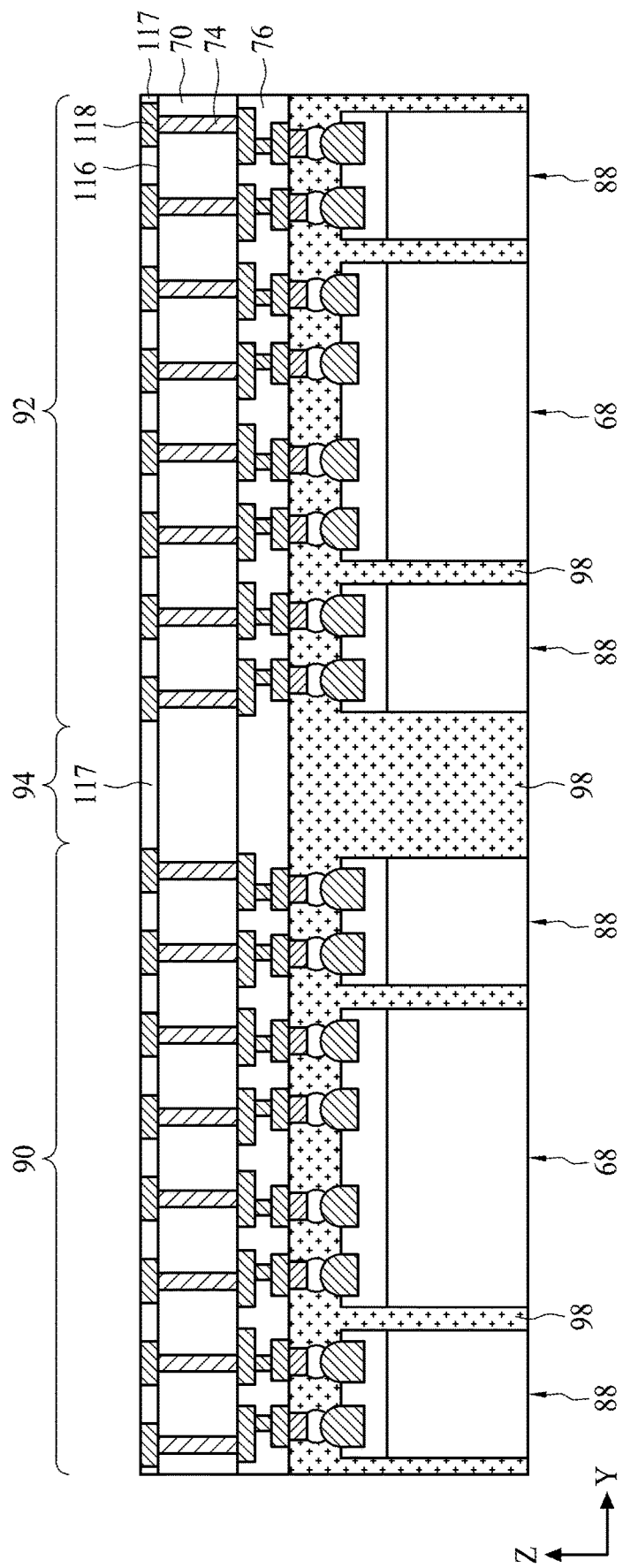

In FIG. 14, a redistribution structure is formed on the second surface 116 of the substrate 70, and is used to electrically connect the TVs 74 together and/or to external devices. The redistribution structure includes one or more dielectric layers 117 and metallization patterns 118 in the one or more dielectric layers 117. The metallization patterns may comprise vias and/or traces to interconnect TVs 74 together and/or to an external device. The metallization patterns 118 are sometimes referred to as Redistribution Lines (RDLs). The dielectric layers 117 may comprise silicon oxide, silicon nitride, silicon carbide, silicon oxynitride, low-k dielectric material, such as PSG, BPSG, FSG, SiOxCy, Spin-On-Glass, Spin-On-Polymers, silicon carbon material, compounds thereof, composites thereof, combinations thereof, or any other suitable material. The dielectric layers 117 may be deposited by any suitable method known in the art, such as spinning, CVD, PECVD, HDP-CVD, combinations thereof, or any other suitable method. The metallization patterns 118 may be formed in the dielectric layer 117, for example, by using photolithography techniques to deposit and pattern a photoresist material on the dielectric layer 117 to expose portions of the dielectric layer 117 that are to become the metallization pattern 118. An etch process, such as an anisotropic dry etch process, may be used to create recesses and/or openings in the dielectric layer 117 corresponding to the exposed portions of the dielectric layer 117. The recesses and/or openings may be lined with a diffusion barrier layer and filled with a conductive material. The diffusion barrier layer may comprise one or more layers of TaN, Ta, TiN, Ti, Co W, combinations thereof, or any other suitable material, deposited by ALD, or any other suitable method, and the conductive material may comprise copper, aluminum, tungsten, silver, combinations thereof, or any other suitable material, deposited by CVD, PVD, plating, or combinations thereof, or any other suitable method. Any excessive diffusion barrier layer and/or conductive material on the dielectric layer may be removed, such as by using a CMP.

Figure 15:
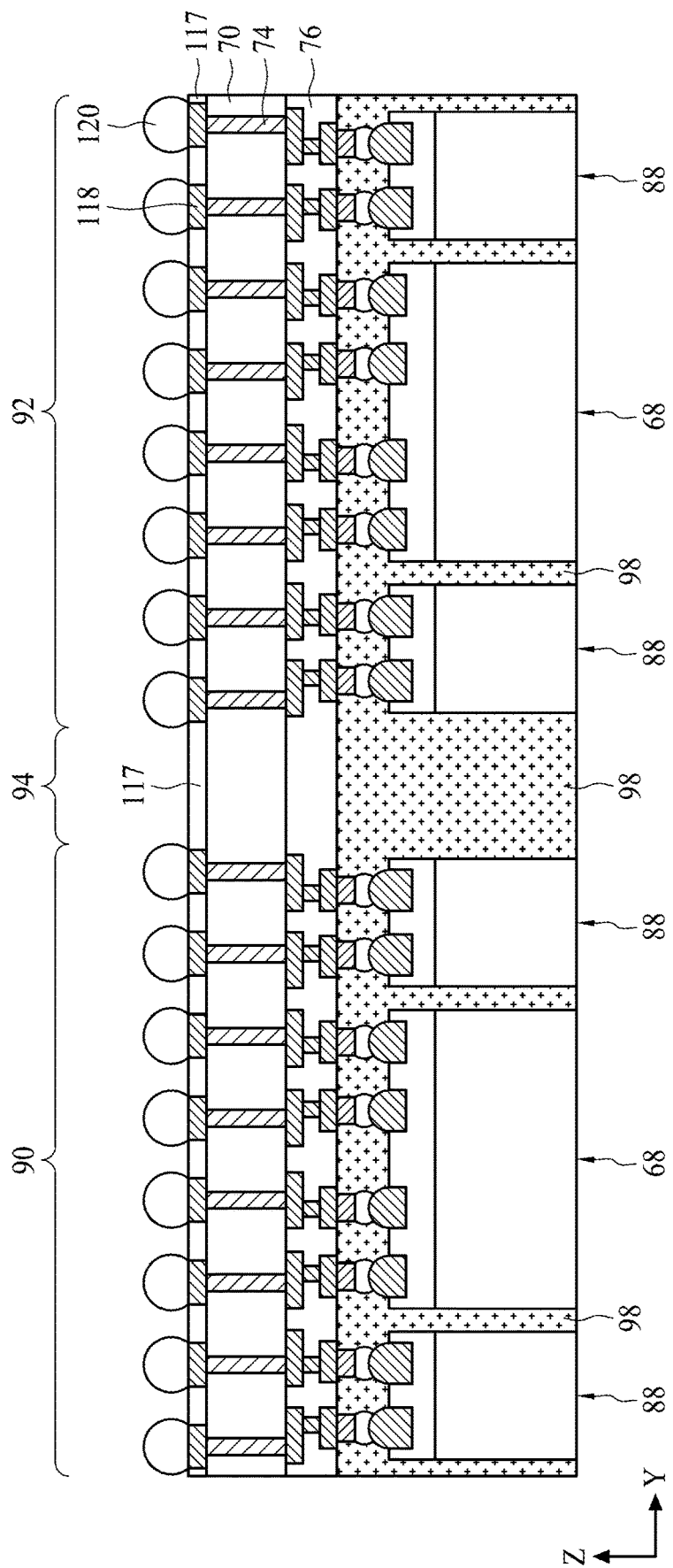

In FIG. 15, electrical connectors 120 are also formed the metallization patterns 118 and are electrically coupled to TVs 74. The electrical connectors 120 are formed at the top surface of the redistribution structure on the metallization patterns 118. In some embodiments, the metallization patterns 118 include UBMs. In the illustrated embodiment, the pads are formed in openings of the dielectric layers 117 of the redistribution structure. In another embodiment, the pads (UBMs) can extend through an opening of a dielectric layer 117 of the redistribution structure and also extend across the top surface of the redistribution structure.

As an example to form the pads, a seed layer (not shown) is formed at least in the opening in one of the dielectric layer 117 of the redistribution structure. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or any other suitable method. A photo resist is then formed and patterned on the seed layer. The photoresist may be formed by spin coating or any other suitable method and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, combinations thereof, or any other suitable method. The conductive material may comprise a metal, like copper, titanium, tungsten, aluminum, combinations thereof, or any other suitable material. Then, the photoresist and portions of the seed layer on which the conductive material is not formed are removed. The photoresist may be removed by an acceptable ashing or stripping process, such as using an oxygen plasma or any other suitable method. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

In some embodiments, the electrical connectors 120 are solder balls and/or bumps, such as ball grid array (BGA) balls, C4 micro bumps, ENIG formed bumps, ENEPIG formed bumps, combinations thereof, or any other suitable bump/ball. The electrical connectors 120 may include a conductive material such as solder, copper, aluminum, gold, nickel, silver, palladium, tin, combinations thereof, or any other suitable material. In some embodiments, the electrical connectors 120 are formed by initially forming a layer of solder through such commonly used methods such as evaporation, electroplating, printing, solder transfer, ball placement, combinations thereof, or any other suitable method. Once a layer of solder has been formed on the structure, a reflow may be performed in order to shape the material into the desired bump shapes.

In some embodiments, the electrical connectors 120 may be coated with a flux before bonding to any other component. The electrical connectors 120 may dipped in the flux using the die dipping structure 100 from FIGS. 1-5. In some embodiments, the electrical connectors 120 may have an epoxy flux (not shown) formed thereon before they are reflowed with at least some of the epoxy portion of the epoxy flux remaining. This remaining epoxy portion may act as an underfill to reduce stress and protect the joints resulting from the reflowing the electrical connectors 120.

The electrical connectors 120 may be used to bond to an additional electrical component, which may be a semiconductor substrate, a package substrate, a Printed Circuit Board (PCB), combinations thereof, or any other suitable substrate (see 300 in FIG. 17).

Figure 16:
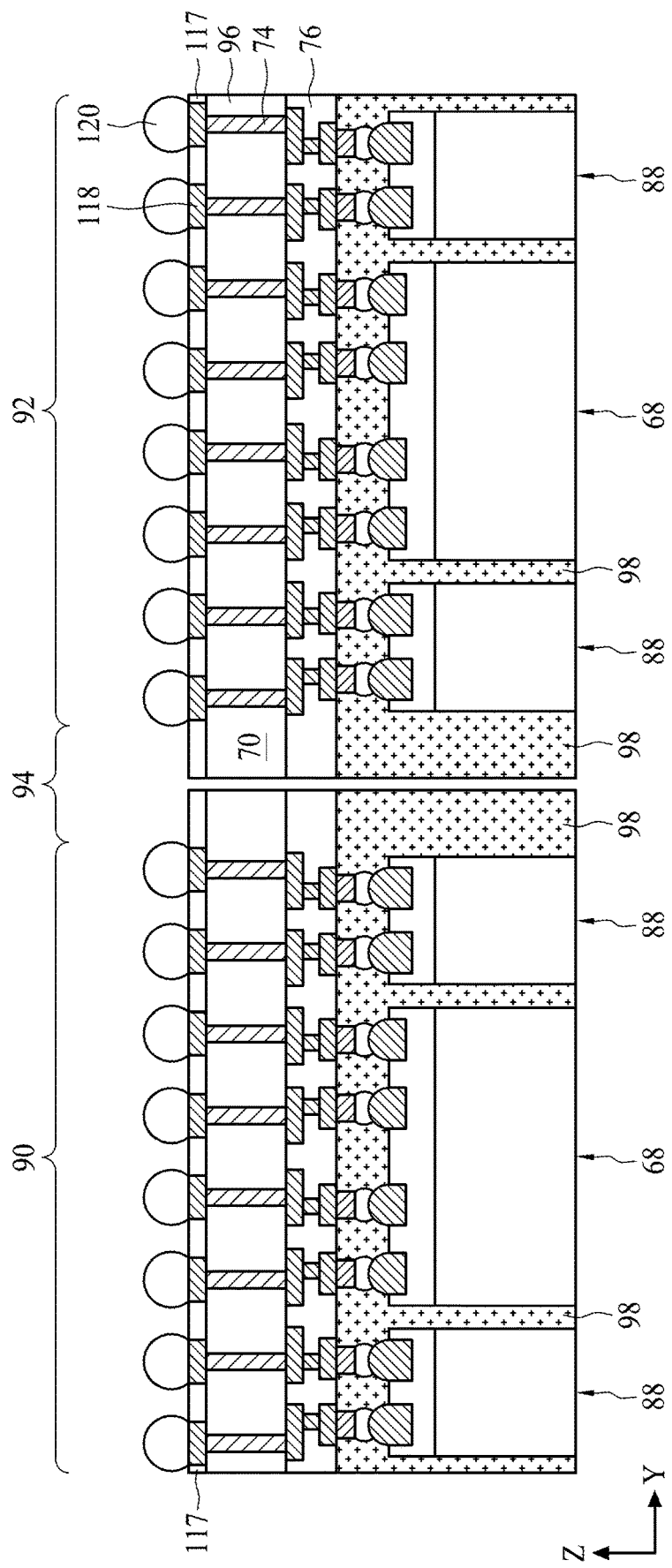

In FIG. 16, components 96 are singulated between adjacent regions 90 and 92 along the region 94 to form component packages 200 comprising, among other things, a die 68, a component 96, and dies 88. The singulation may be by sawing, dicing, combinations thereof, or any other suitable method.

FIG. 17 illustrates the attachment of a component package 200 on a substrate 300. Electrical connectors 120 are aligned to, and are put against, connectors of the substrate 300. The electrical connectors 120 may be reflowed to create a bond between the substrate 300 and the component 96. The substrate 300 may comprise a package substrate, such as a build-up substrate including a core therein, a laminate substrate including a plurality of laminated dielectric films, a PCB, combinations thereof, or any other suitable substrate. The substrate 300 may comprise electrical connectors (not shown), such as solder balls, opposite the component package to allow the substrate 300 to be mounted to another device. An underfill material (not shown) can be dispensed between the component package 200 and the substrate 300 and surrounding the electrical connectors 120. The underfill material may be any accept able material, such as a polymer, epoxy, molding underfill, combinations thereof, or any other suitable material.

Additionally, one or more surface devices 140 may be connected to the substrate 300. The surface devices 140 may be used to provide additional functionality or programming to the component package 200, or the package as a whole. In an embodiment, the surface devices 140 may include surface mount devices (SMDs) or integrated passive devices (IPDs) that include passive devices such as resistors, inductors, capacitors, jumpers, combinations thereof, or any other suitable component that are desired to be connected to and utilized in conjunction with component package 200, or other parts of the package. The surface devices 140 may be placed on a first major surface of the substrate 300, an opposing major surface of the substrate 300, or both, according to various embodiments.

In one aspect of the present disclosure, a die dipping structure is disclosed. The die dipping structure includes a plate including a first recessed portion having a first depth and filled with a first flux material. The plate further includes a second recessed portion, isolated from the first recessed portion, with a second depth and filled with a second flux material. The second depth is different from the first depth. The die dipping structure further includes a motor configured to move the plate so as to simultaneously dip a first die and a second die into the flux of the first recessed portion and the flux of the second recessed portion, respectively.

In another aspect of the present disclosure, a die dipping structure is disclosed. The die dipping structure includes an arm configured to hold a first die and a second die. The first die has a first connector with a first height, and the second die has a second connector with a second height. The die dipping structure further includes a plate including a first recessed portion containing a first flux material. The first flux material has a third height. The die dipping structure further includes a second, discrete recessed portion containing a second flux material. The second flux material has a fourth height. The first height and the second height correspond to the third height and the fourth height, respectively. The die dipping structure further includes a motor configured to move the plate to align the first connector and second connector with the first recessed portion and the second recessed portion, respectively.

In yet another aspect of the present disclosure, a method includes providing a plate comprising a first recessed portion having a first depth and being filled with a first flux material, and a second recessed portion having a second depth and being filled with a second flux material. The second depth is different from the first depth. The method further includes concurrently dipping a first die into the first recessed portion and dipping a second die into the second recessed portion so as to coat a first connector of the first die and a second connector of the second die with the first flux material and the second flux material, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die dipping structure, comprising:
   a plate comprising:
      a first recessed portion having a first depth and being filled with a first flux material; and
      a second recessed portion, isolated from the first recessed portion, having a second depth and being filled with a second flux material, wherein the second depth is different from the first depth; and
   a motor configured to move the plate so as to simultaneously dip a first die and a second die into the flux of the first recessed portion and the flux of the second recessed portion, respectively.

2. The die dipping structure of claim 1, wherein the first recessed portion and the second recessed portion are laterally spaced apart from each other at a distance greater than or equal to 1 millimeter.

3. The die dipping structure of claim 1, wherein the first depth is greater than or equal to 20 micrometers.

4. The die dipping structure of claim 1, wherein the second depth is greater than or equal to 1 micrometer.

5. The die dipping structure of claim 1, wherein the first flux material and the second flux material are different.

6. The die dipping structure of claim 1, wherein the first flux material and the second flux material are the same.

7. The die dipping structure of claim 1, further comprising an arm configured to hold a first die and a second die, with the first die having a first top surface facing down and the second die having a second top surface facing down, wherein the first die has a first connector with a first height on the first top surface, and the second die has a second connector with a second height on the second top surface.

8. The die dipping structure of claim 7, wherein the first height corresponds to the first depth, and the second height corresponds to the second depth.

9. A die dipping structure, comprising:
   an arm configured to hold a first die and a second die, wherein the first die has a first connector with a first height and the second die has a second connector with a second height;
   a plate comprising:
      a first recessed portion containing a first flux material, the first flux material having a third height;
      a second, discrete recessed portion containing a second flux material, the second flux material having a fourth height, wherein the first height and second height correspond to the third height and fourth height, respectively; and
   a motor configured to move the plate to align the first connector and second connector with the first recessed portion and the second recessed portion, respectively.

10. The die dipping structure of claim 9, wherein the first height is greater than the third height, and the second height is greater than the fourth height.

11. The die dipping structure of claim 10, wherein a first ratio of the third height to the first height and a second ratio of the fourth height to the second height are both less than or equal to 0.6.

12. The die dipping structure of claim 9, wherein the first recessed portion is laterally spaced apart from the second recessed portion from each other at a distance greater than or equal to 1 millimeter.

13. The die dipping structure of claim 9, wherein the third height is greater than or equal to 20 micrometers.

14. The die dipping structure of claim 9, wherein the fourth height is greater than or equal to 1 micrometer.

15. The die dipping structure of claim 9, wherein the first flux material and the second flux material are the same or different.

16. The die dipping structure of claim 9, wherein the first recessed portion comprises a first depth, the second recessed portion comprises a second depth equal to the first depth, and the third height is different from the fourth height.

17. The die dipping structure of claim 9, wherein the first recessed portion comprises a first depth, the second recessed portion comprises a second depth, the third height is less than the first depth, and the fourth height is less than the second depth.

18. A method, comprising:
   providing a plate comprising a first recessed portion having a first depth and being filled with a first flux material, and a second recessed portion having a second depth and being filled with a second flux material, wherein the second depth is different from the first depth; and
   concurrently dipping a first die into the first recessed portion and dipping a second die into the second recessed portion, so as to coat a first connector of the first die and a second connector of the second die with the first flux material and second flux material, respectively.

19. The method of claim 18, wherein concurrently dipping a first die into the first recessed portion and dipping a second die into the second recessed portion further comprises:
   moving the plate, via a motor, to align with the first die and the second die.

20. The method of claim 18, wherein the first connector corresponds to the first depth, and the second connector corresponds to the second depth.

\* \* \* \* \*